(12) United States Patent
Kennedy et al.

(10) Patent No.: US 11,602,070 B1
(45) Date of Patent: Mar. 7, 2023

(54) AISLE CONTAINMENT SYSTEM FOR DATA CENTERS

(71) Applicant: TATE ACCESS FLOORS, INC., Jessup, MD (US)

(72) Inventors: Daniel Brent Kennedy, Lovettsville, VA (US); Gwen Demosky, Ellicott City, MD (US); Benjamin Lee Steinberg, Baltimore, MD (US); Brian Prats, Baltimore, MD (US)

(73) Assignee: TATE ACCESS FLOORS, INC., Jessup, MD (US)

( * ) Notice: Subject to any disclaimer, the term of this patent is extended or adjusted under 35 U.S.C. 154(b) by 0 days.

(21) Appl. No.: 17/666,610

(22) Filed: Feb. 8, 2022

(51) Int. Cl.
   *H05K 7/18* (2006.01)
   *H05K 7/14* (2006.01)

(52) U.S. Cl.
   CPC ............ *H05K 7/18* (2013.01); *H05K 7/1408* (2013.01); *H05K 7/1485* (2013.01)

(58) Field of Classification Search
   None
   See application file for complete search history.

(56) References Cited

U.S. PATENT DOCUMENTS

| 11,382,232 | B1* | 7/2022 | Madhavkant | H05K 7/1487 |
| 2017/0127569 | A1* | 5/2017 | Rimler | F24F 13/0254 |
| 2018/0279498 | A1* | 9/2018 | Jiang | E05D 15/0656 |
| 2018/0338393 | A1* | 11/2018 | Curtin | H05K 7/20745 |
| 2019/0261533 | A1* | 8/2019 | Latino | H05K 7/20745 |

* cited by examiner

*Primary Examiner* — James Wu
*Assistant Examiner* — Christopher L Augustin
(74) *Attorney, Agent, or Firm* — Oliff PLC

(57) ABSTRACT

An upper portion of an aisle containment system for a data center. The upper portion includes spaced vertical supports aligned in two parallel rows and horizontal supports that extend between and are connected to adjacent vertical supports to form the basic framework of the upper portion. The upper portion also includes (1) at least one pair of arms that extend outwardly from opposite longitudinal sides of the basic framework and are configured to support services and (2) at least one busbar casement that is attached to the vertical supports and extends substantially the length of the upper portion. Each arm of the at least one pair of arms includes a segment that is rotatable between a first position in which the segment is substantially parallel to the vertical supports and a second position in which the segment is substantially perpendicular to the vertical supports.

9 Claims, 9 Drawing Sheets

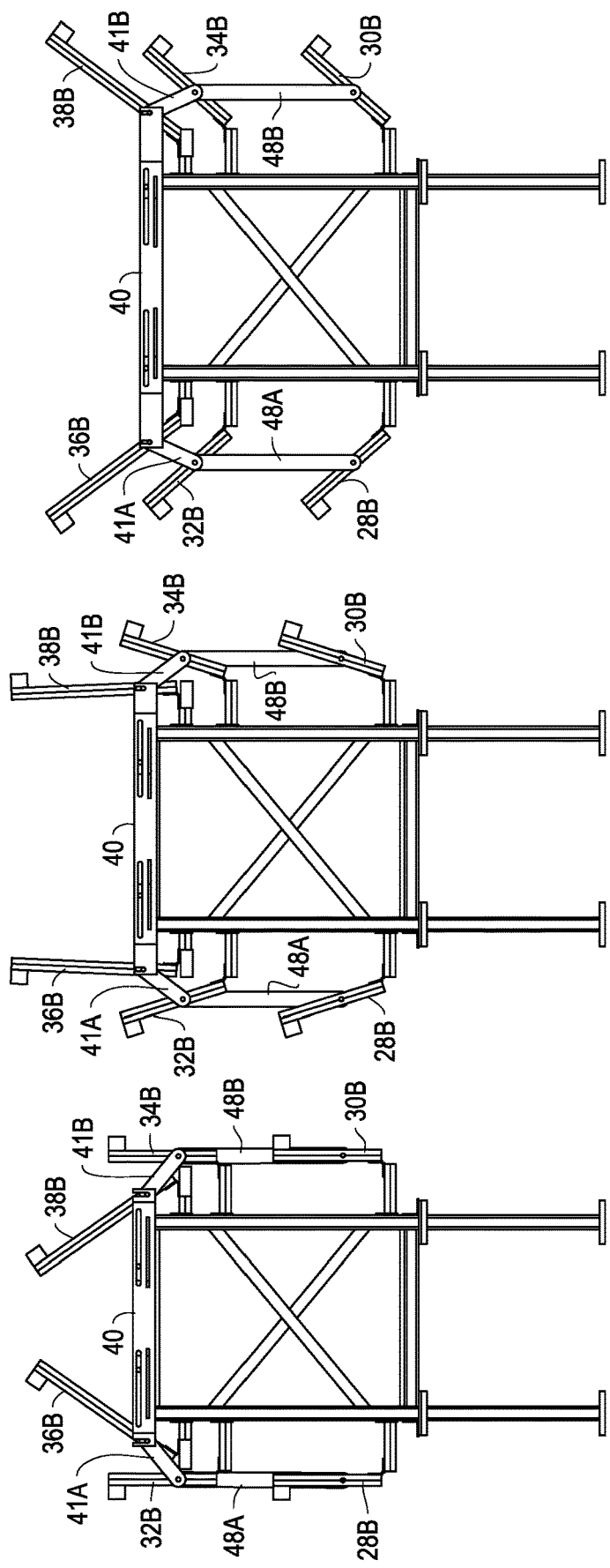

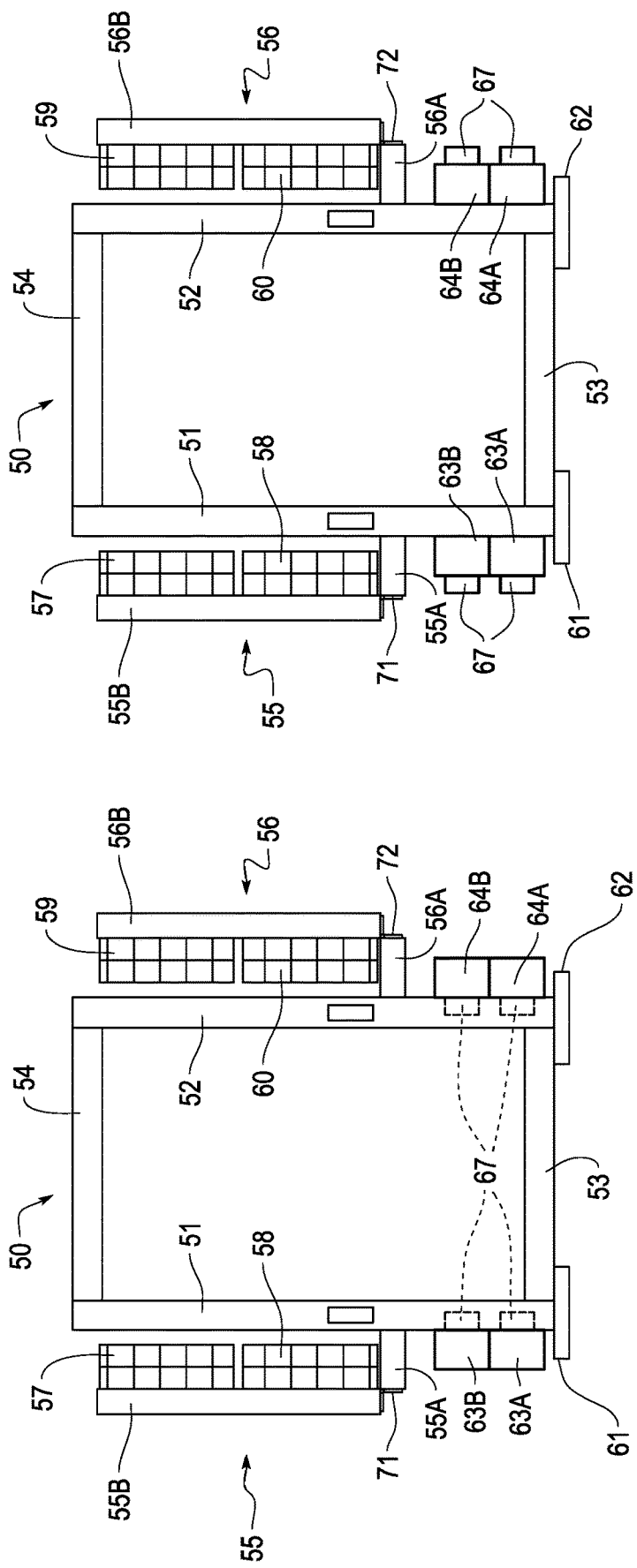

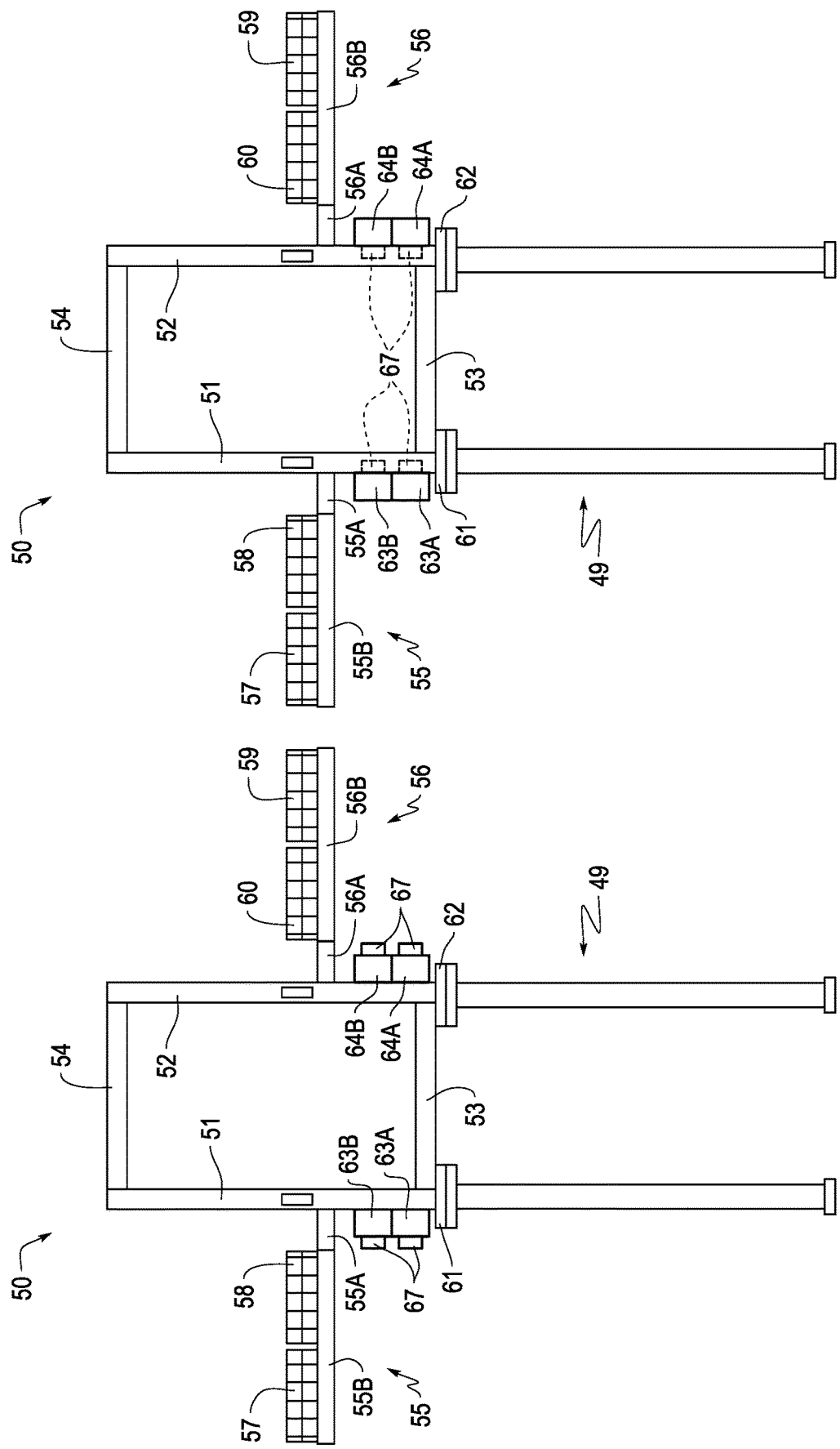

AISLE CONTAINMENT SYSTEM FOR DATA CENTERS

FIELD OF THE INVENTION

This invention relates to data centers having spaced rows of cabinets housing or otherwise supporting a plethora of computer and other IT equipment. More particularly, this invention relates to assemblies and/or systems that support the apparatuses that provide or distribute electricity and other services to the computer and other IT equipment housed in or otherwise supported by the rows of cabinets.

BACKGROUND OF THE INVENTION

Data centers are rooms or other spaces in buildings that contain a plethora of computer and other IT equipment that receives, stores, processes and transmits data electronically. That computer and other IT equipment is usually housed in or otherwise supported by cabinets that each house or support various pieces of such equipment.

Those cabinets are usually positioned in spaced, parallel rows. The aisles formed between those rows usually alternate between cold and hot aisles. A cold aisle is an aisle that receives cooling air to be passed through the cabinets to cool the computer and other IT equipment housed therein or otherwise supported thereby. A hot aisle is an aisle that receives the cooling air after it passes through the cabinets. That "heated" cooling air is then recycled or conveyed out of the data center.

Obviously, electricity and other services must be provided to the computer and other IT equipment housed in and otherwise supported by the cabinets. The apparatus that provides the electricity and other services, such as busbars and cables, is usually supported by framework around and supporting the cabinets. That framework is known in the trade and referred to herein as aisle containment systems.

Aisle containment systems usually include arms that extend outward from each row of cabinets to support the busbar casements, cable trays, lighting fixtures, security fixtures, etc. Also, often the busbar casements are located on the free ends of those arms, as described in more detail below and illustrated in FIGS. 1-6. Due, in part, to the location of the busbar casements on the free ends of the arms and the length of the busbars and their casements, the structure to support those casements and busbars is often relatively cumbersome and expensive.

Data center builders prefer that aisle containment systems be constructed remotely at a manufacturing site and then transported to job sites to achieve quicker assembly of the aisle containment systems and the rows of cabinets at job sites and to reduce complications from installing the aisle containment systems and cabinets at job sites. Moreover, those builders prefer that the busbars be inserted in their casements at the manufacturing site and shipped in place due to the difficulty of installing busbars at job sites.

However, those preferences present problems due to the size of the aisle containment systems and busbars. For example, one "standard" size of aisle containment systems is approximately 50 feet long, 4 feet wide and 14 feet high. The busbars extend substantially the length of the aisle containment systems.

Because of that relatively large size, obstacles are encountered in transporting aisle containment systems from their manufacturing site to job sites at which the systems are to be deployed and maneuvering those systems in place once they are at the job sites. To date, those obstacles have been addressed by (1) dividing the systems into upper and lower sections, to reduce the height of the modules being shipped and handled, and (2) having the arms be foldable to positions substantially parallel to vertical supports of the systems. However, even when the arms are folded, often the casements for the busbars and the busbars themselves are susceptible to damage because they are positioned at the free ends of the arms, as discussed above.

Accordingly, there is a need in the industry to reduce the risk of damage to busbar casements and the busbars therein during transport of the aisle containment systems including those casements and maneuvering the systems on job sites.

Also, there is always a need to reduce the costs of the aisle containment systems.

The aisle containment systems of this invention address those needs, as well as other needs that are readily apparently to those of skill in the art.

SUMMARY OF THE INVENTION

The upper portion of an aisle containment system for a data center of some embodiments of this invention includes spaced vertical supports aligned in two parallel rows and defining two longitudinal sides of the upper portion, spaced horizontal supports that extend between and are attached to the spaced vertical supports, at least one pair of arms that are attached to the vertical supports or the horizontal supports and are configured to support services, and at least one busbar casement. One arm of the at least one pair of arms may extend outwardly from each of the two longitudinal sides and each arm may include at least one segment having a first position in which the segment is substantially parallel to the vertical supports and a second position in which the segment is substantially perpendicular to the vertical supports. The at least one busbar casement may be attached to the vertical supports and extend substantially parallel to the two longitudinal sides, substantially the length of the upper portion.

In some embodiments of this invention, the at least one busbar casement includes openings in an exterior sidewall to receive connectors to a busbar housed in the at least one busbar casement. Those openings may be elongated slots.

In other embodiments of this invention, there is at least one of the busbar casements at each of the two longitudinal sides of the upper portion.

In yet other embodiments of this invention, there are at least two of the busbar casements at each of the two longitudinal sides.

In certain embodiments of the invention, the at least one busbar casement is attached to lower ends of the vertical supports. The at least one busbar casement may be attached to the lower ends of the vertical supports below the at least one pair of arms.

In further embodiments of the invention, the at least one busbar casement does not extend farther outwardly from the vertical supports than the at least one pair of arms, including when the at least one segment of the at least one pair of arms is in the first position.

BRIEF DESCRIPTION OF THE DRAWINGS

FIGS. 2-6 are end elevation views of the prior art aisle containment system illustrated in FIG. 1, showing the transformation of the upper portion of the system from its transport mode to its deployed mode, with FIG. 6 showing the upper portion in its deployed mode.

FIG. 7 is an end elevation view of one embodiment of the upper portion of an aisle containment system for a data center of this invention, intended for use in a hot aisle of the data center, showing the upper portion in its transport mode.

FIG. 8 is an end elevation view of a second embodiment of the upper portion of an aisle containment system for a data center of this invention, intended for use in a cold aisle of the data center, showing the upper portion in its transport mode.

FIG. 9 is an end elevation view of the upper portion of an aisle containment system illustrated in FIG. 8, showing the upper portion in its deployed mode, mounted on a lower support assembly.

FIG. 10 is an end elevation view of the upper portion of an aisle containment system illustrated in FIG. 7, showing the upper portion in its deployed mode, mounted on a lower support assembly.

DESCRIPTION OF PRIOR ART

Figure 1:
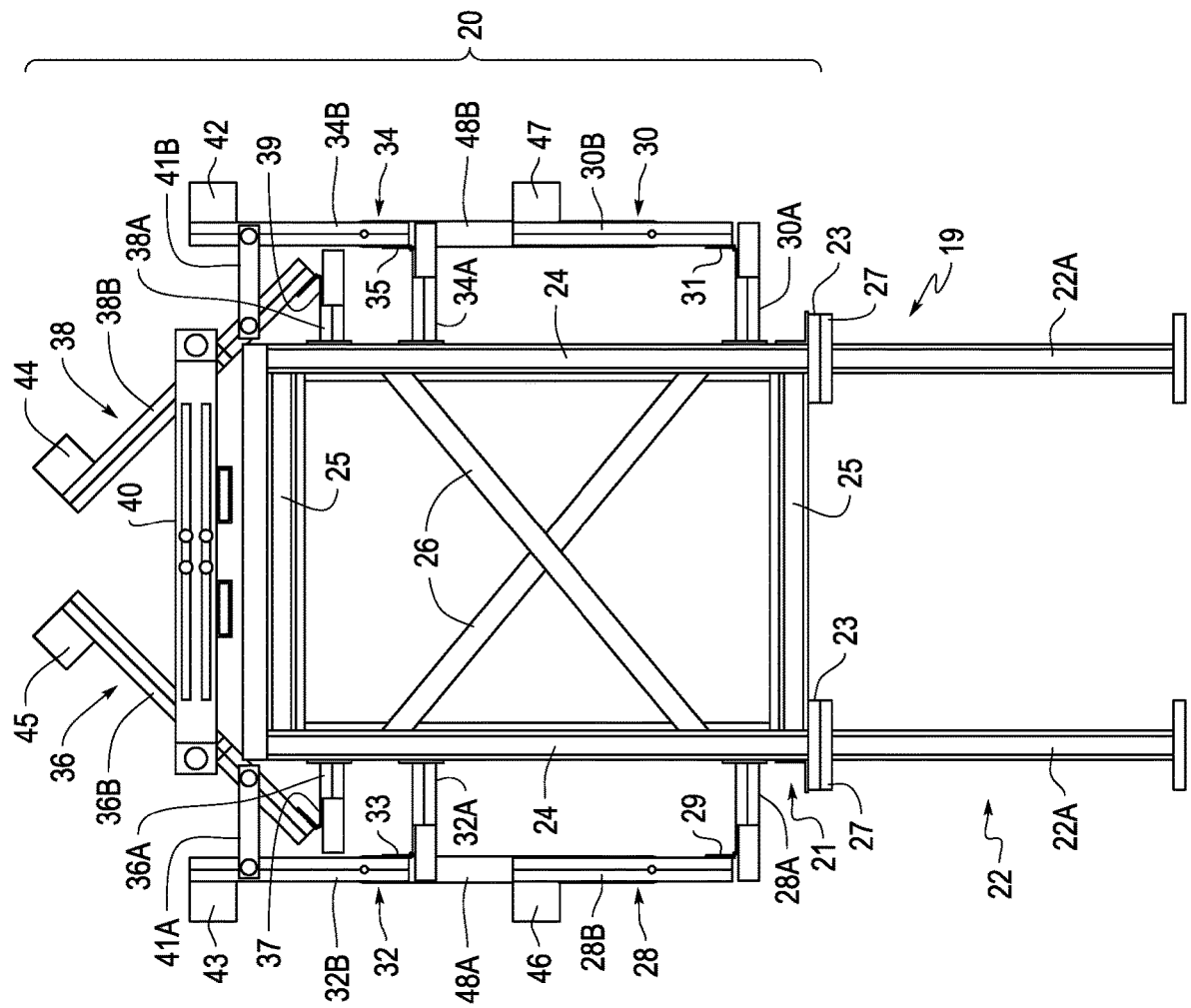
FIG. 1 is an end elevation view of an example of a prior art aisle containment system for a data center, showing the upper portion of the system in its transport mode.

As stated, an example of a prior art aisle containment system for a data center, aisle containment system 19, is illustrated in FIGS. 1-6.

Aisle containment system 19 includes upper portion 20 and lower support assembly 22.

Upper portion 20 includes support frame 21, arms 28, 30, 32, 34, 36 and 38, arms linkages 40, 41A, 41B, 48A and 48B, busbar casements 42-47 and support plates 23.

Support frame 21 includes spaced vertical supports 24, spaced horizontal supports 25 and cross supports 26. Spaced vertical supports 24 are arranged in two parallel rows. Horizontal supports 25 extend between and are connected on their ends to adjacent vertical supports 24. Cross supports 26 extend diagonally between and are connected on their ends to adjacent vertical supports 24 to provide stability for support frame 21.

Each arm 28 is comprised of arm segments 28A and 28B connected by hinge 29. Each arm segment 28A is fixedly attached to a vertical support 24 and is substantially perpendicular to that vertical support 24. Each arm 30 is comprised of arm segments 30A and 30B connected by hinge 31. Each arm segment 30A is fixedly attached to a vertical support 24 and is substantially perpendicular to that vertical support 24. Each arm 32 is comprised of arm segments 32A and 32B connected by hinge 33. Each arm segment 32A is fixedly attached to a vertical support 24 and is substantially perpendicular to that vertical support 24. Each arm 34 is comprised of arm segments 34A and 34B connected by hinge 35. Each arm segment 34A is fixedly attached to a vertical support 24 and is substantially perpendicular to that vertical support. Each arm 36 is comprised of arm segments 36A and 36B connected by hinge 37. Each arm segment 36A is fixedly attached to a vertical support 24 and is substantially perpendicular to that vertical support 24. Each arm 38 is comprised of arm segments 38A and 38B connected by hinge 39. Each arm segment 38A is fixedly attached to a vertical support 24 and is substantially perpendicular to that vertical support 24.

Figure 6:
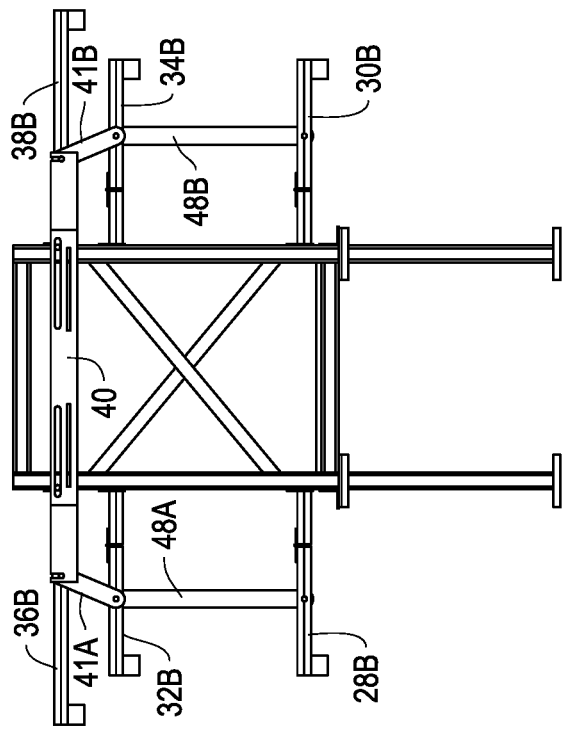
Figure 5:
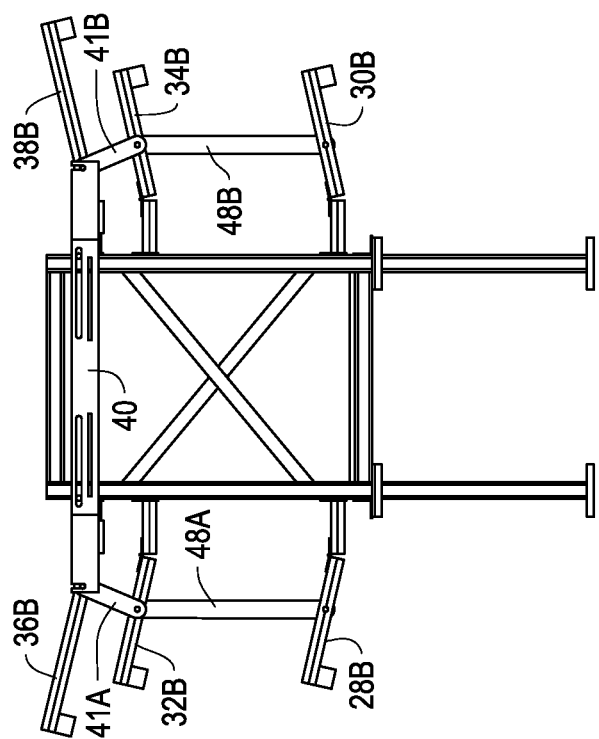

Arm segments 28B, 30B, 32B, 34B, 36B and 38B are rotatable around pivot axes of hinges 29, 31, 33, 35, 37 and 39, respectively, between transport or folded positions, in which arm segments 28B, 30B, 32B, 34B, 36B and 38B are substantially parallel to vertical supports 24, as shown in FIG. 1, and deployed positions, in which arm segments 28B, 30B, 32B, 34B, 376B and 38B are substantially perpendicular to vertical supports 24, as shown in FIG. 6.

Arms linkage 40 connects arm segments 36B and 38B. Arms linkage 41A connects arm segments 32B and 36B. Arms linkage 41B connects arm segments 34B and 38B. Arms linkage 48A connects arm segments 28B and 32B. Arms linkage 48B connects arm segments 30B and 34B. Arms linkages 40, 41A, 41B, 48A and 48B are utilized to move arm segments 32B, 34B, 36B and 38B in unison between their transport and deployed modes.

Busbar casement 46 is at a free end of arm portion 28B. Busbar casement 47 is at a free end of arm portion 30B. Busbar casement 42 is at the free end of arm portion 34B. Busbar casement 43 is at the free end of arm portion 32B. Busbar casement 44 is at the free end of arm portion 38B. Busbar casement 45 is at the free end of arm portion 36B. Busbar casements 42-47 house busbars that extend substantially the length of the aisle containment system 19.

Support plates 23 are located at the lower end of support frame 21.

Lower support assembly 22 includes a framework that includes a plurality of support legs 22A and support plates 27.

Support plates 23 and support plates 27 are connected to attach lower support assembly 22 and upper portion 20.

In that regard, lower support assembly 22 and upper portion 20 can be separately transported from the manufacturing facility to the job site and separately maneuvered at the job site when lower support assembly 22 and upper portion 20 are not connected, i.e., when support plates 23 and support plates 27 are not connected. Lower support assembly 22 can then be attached to upper portion 20 by connecting support plates 23 and support plates 27 when aisle containment system 19 is at its intended location at the job site.

Also, arms 28, 30, 32, 34, 36 and 38 can be in their transport or folded positions, shown in FIG. 1, when upper portion 20 is transported from the manufacturing facility to the job site and maneuvered in place at the job site. Arms 28, 30, 32, 34, 36 and 38 can be moved from their transport or folded positions to their deployed positions, as shown by FIGS. 2-6, when in the desired location at the job site.

DETAILED DESCRIPTION OF EMBODIMENTS OF THE INVENTION

As stated, one embodiment of an upper portion of an aisle containment system for a hot aisle of a data center of this invention, upper portion 50, is illustrated in FIGS. 7 and 10. As also stated above, the transport mode of upper portion 50 is illustrated in FIG. 7 and the deployed mode of upper portion 50 is illustrated in FIG. 10. In FIG. 10, upper portion 50 is attached to lower support assembly 49 to form the aisle containment system.

While FIGS. 7 and 10 illustrate an embodiment of this invention for use in a hot aisle, FIGS. 8, 9, 11 and 12 illustrate an embodiment of this invention for use in a cold aisle. The only difference between the two embodiments is the direction that the slots in the side walls of the busbar casements (discussed below) face-inwardly for a hot aisle and outwardly for a cold aisle. Accordingly, the same reference numbers are used for both embodiments in the figures.

Figure 11:
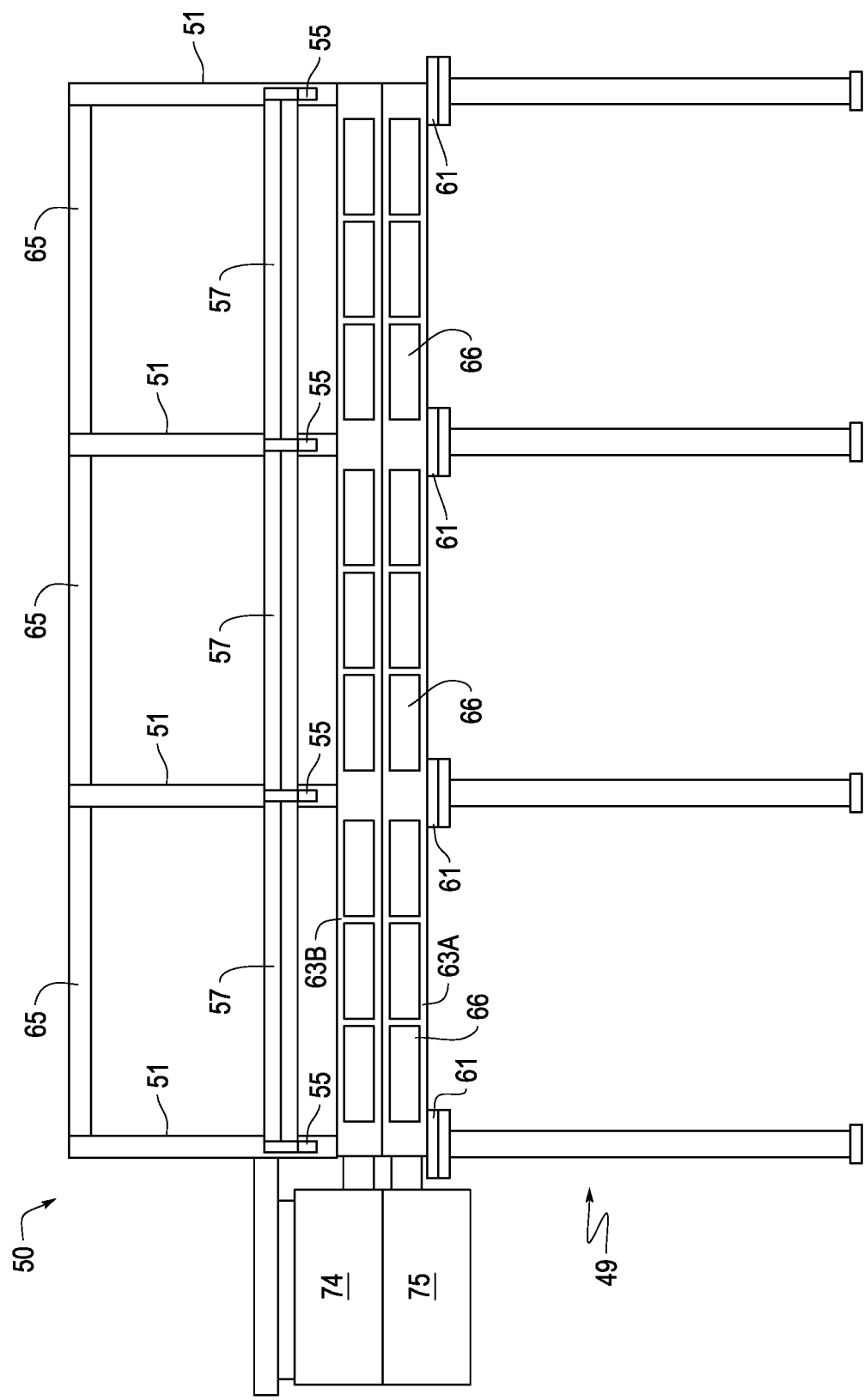
FIG. 11 is a side elevation view of the aisle containment system illustrated in FIGS. 8 and 9, showing the upper portion in its deployed mode.
Figure 12:
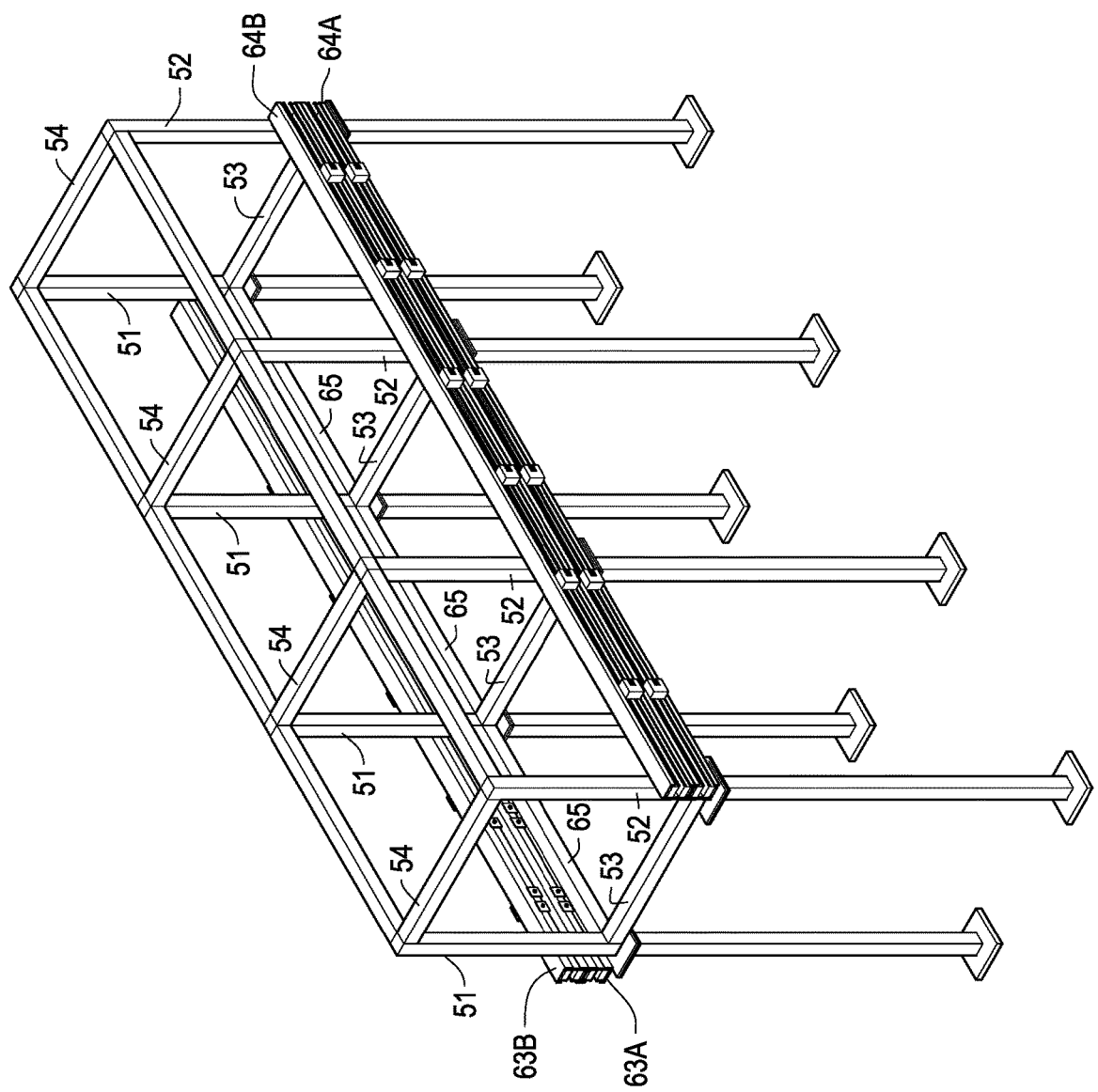
FIG. 12 is a top perspective view of the embodiment illustrated FIGS. 8, 9 and 11, with the arms of the embodiment removed.

In both embodiments, upper portion 50 includes spaced vertical supports 51 and 52, lower lateral horizontal supports 53, upper lateral horizontal supports 54, longitudinal horizontal supports 65 (shown in FIG. 12), arms 55 and 56, cable trays 57-60, support plates 61 and 62, busbar casements 63A, 63B, 64A and 64B and infeed systems 74 and 75 (shown in FIG. 11).

Vertical supports 51 and 52 are arranged in parallel rows. Each vertical support 51 is paired with a vertical support 52 in the longitudinal direction. The parallel rows of vertical supports 51 and 52 define two longitudinal sides of upper portion 50.

Each lower lateral horizontal support 53, upper lateral horizontal support 54 and longitudinal horizontal support 65 extends between and is connected on its ends to a pair of adjacent vertical supports 51 and/or 52.

While these embodiments of the invention include lower lateral horizontal supports 53, upper lateral horizontal supports 54 and longitudinal horizontal supports 65 connecting the various vertical supports 51 and 52 to provide the basic framework of upper portion 50, other embodiments of this invention may include additional horizontal supports and/or diagonal cross supports between the vertical supports, such as cross supports 26 of prior art upper portion 20, depending on the application. Indeed, the support members of the upper portions of aisle containment systems of this invention can be any structural members that provide the framework and structural stability to support the various arms and busbar casements (discussed below) of those upper portions.

Each arm 55 includes arm segments 55A and 55B connected by hinge 71. Each arm 56 includes arm segments 56A and 56B connected by hinge 72. Each arm segment 55A is connected to a vertical support 51 and is substantially perpendicular to that vertical support 51. Each arm segment 56A is connected to a vertical support 52 and is substantially perpendicular to that vertical support 52. While, in these embodiments of the invention, arm segments 55A and 56A are connected to vertical supports 51 and 52, respectively, in other embodiments of this invention, similar arm segments can be attached to other supports of the upper portion.

Arm segments 55B and arm segments 56B are rotatable around pivot axes of hinges 71 and 72, respectively, between transport or folded positions, in which arm segments 55B and 56B are substantially parallel to vertical supports 51 and 52, respectively, as shown in FIGS. 7 and 8, and deployed positions, in which arm segments 55B and 56B are substantially perpendicular to vertical supports 51 and 52, respectively, as shown in FIG. 9-11.

While the only arms of these embodiments of the invention are arms 55 and 56, with only one of arms 55 and 56 being connected to a vertical support 51 or a vertical support 52, respectively, the upper portions of other embodiments of this invention may include multiple arms attached or mounted to a single vertical support 51, a single vertical support 52 or any other support members. Also in other embodiments of this invention, the arms can consist of other than two arm segments connected by a hinge.

Cable trays 57 and 58 are attached to arm segments 55B. Cable trays 59 and 60 are attached to arm segments 56B. In other embodiments of this invention, service item supports other than cable trays can be attached to the arms, either in addition to or instead of cable trays.

Busbar casements 63A and 63B are fastened to the lower ends of vertical supports 51 and/or to longitudinal horizontal supports 65 extending between adjacent vertical supports 51, and extend longitudinally substantially the length of upper portion 50. Likewise, busbar casements 64A and 64B are fastened to the lower ends of vertical supports 52 and/or to longitudinal horizontal supports 65 extending between adjacent vertical supports 52, and extend longitudinally substantially the length of upper portion 50.

In these embodiments of the invention, busbar casements 63A, 63B, 64A and 64B are attached to vertical supports 51, vertical supports 52 and/or longitudinal horizontal supports 65 by welding. In other embodiments of the invention, other attachment means/methods can be employed.

Figure 14:
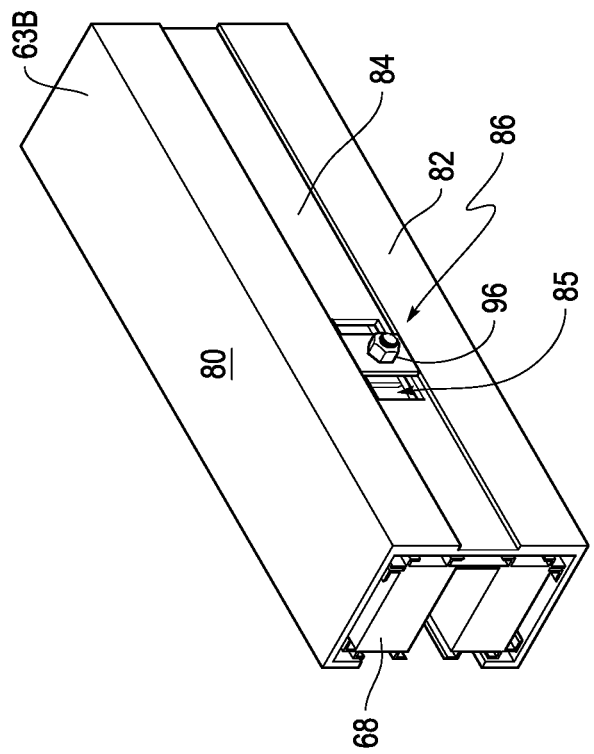
FIG. 14 is a top perspective view of the busbar casement, busbar and bracket assembly illustrated in FIG. 13, showing the busbar in the busbar casement.
Figure 13:
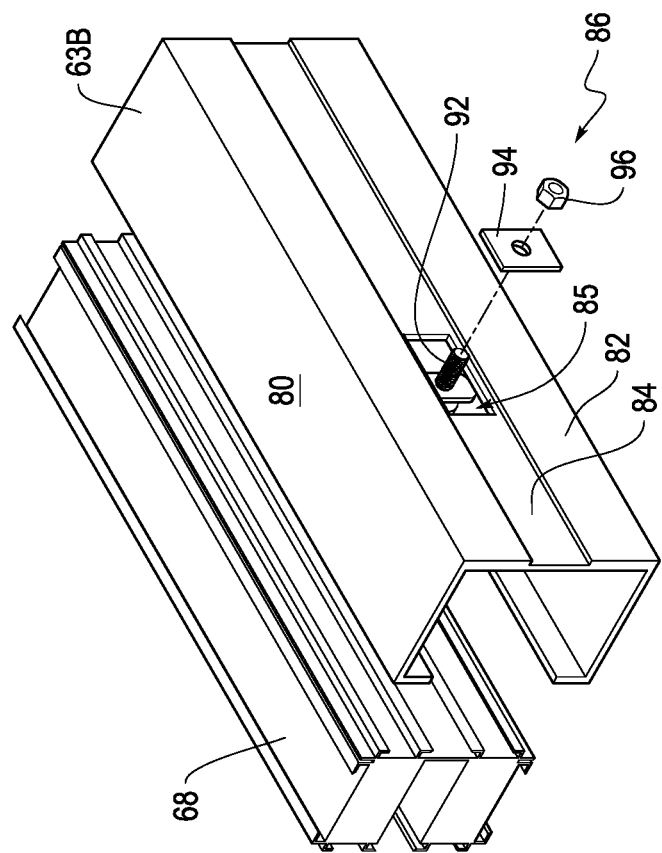
FIG. 13 is a top perspective view of (1) a busbar casement of the embodiments of this invention illustrated in FIGS. 7-12, (2) a busbar that can be received and retained in the busbar casement and (3) a bracket assembly to affix the busbar casement and the busbar.

Busbar casements 63A, 63B, 64A and 64B are configured to receive and retain busbars, such as busbar 68. See FIGS. 13-15, which show busbar 68 and busbar casement 63B.

Specifically, in this embodiment of the busbar casements of this invention, busbar casement 63B includes top portion 80, lower portion 82 and indented portion 84. Indented portion 84 includes a series of spaced holes 85 that receive threaded shafts 92 of bolts 88 of bracket assemblies 86, as described below.

Bracket assemblies 86 affix busbar 68 to busbar casement 63B.

Figure 15:
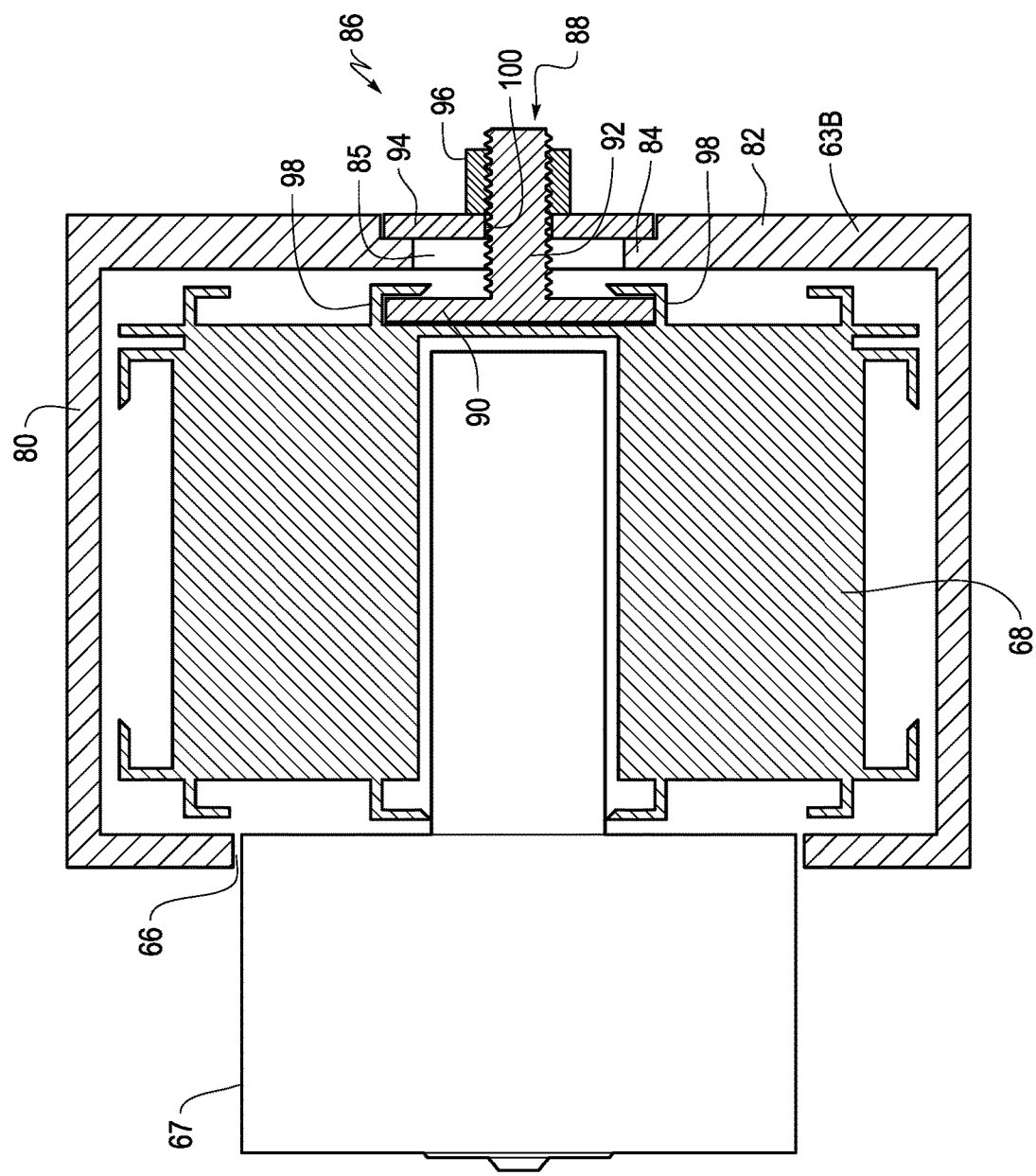
FIG. 15 is a cross sectional view of the busbar casement, busbar and bracket assembly illustrated in FIGS. 13 and 14, with a module attached to the busbar.

More specifically, bracket assembly 86 includes bolt 88, with head 90 and threaded shaft 92, plate 94 and nut 96. Head 90 of bolt 88 is received and retained between flanges 98 of busbar 68, as shown in FIG. 15. Threaded portion 92 of bolt 88 passes through hole 85 in indented portion 84 of busbar casement 63B. Plate 94 is placed around threaded shaft 92. Plate 94 has hole 100 through which threaded shaft 92 passes. An outer periphery of plate 94 abuts an outer surface of indented portion 84 around hole 85. Nut 96 threadedly engages the threads of threaded shaft 94 and is tightened to firmly attach busbar 68 and casement 63B.

Busbars are attached to the other busbar casements 63A, 64A and 64B in a similar manner with other basket assemblies 86.

Busbar casements 63A and 63B extend outwardly from vertical supports 51 a distance less than the distance arm segments 55A extend outwardly from vertical supports 51. Likewise, busbar casements 64A and 64B extend outwardly from vertical supports 52 a distance less than the distance arm segments 56A extend outwardly from vertical supports 52.

While, in these embodiments of the invention, two busbar casements are included on each side of upper portion 50, the upper portions of other embodiments of this invention may include only one or three or more busbar casements on each side. Also, the number of busbar casements on each side does not have to be equal. For example, one of side could have one busbar casement, and the other side could have two busbar casements. As a further example, one side could have no busbar casements, and the other side could have one or more busbar casements.

Busbar casements 63A, 63B, 64A and 64B have sidewall slots 66 to receive modules (discussed below). In the FIGS. 7 and 10 embodiment of this invention, slots 66 face hot aisles in the data center. In the FIGS. 8, 9, 11 and 12 embodiment of this invention, slots 66 face cold aisles of the data center.

Modules, such as modules 67, can be attached to busbar casements 63A, 63B, 64A and 64B, such that the modules are in electrical contact with busbars housed in those casements, such as busbars 68, through slots 66. See FIG. 15.

Infeed systems 74 and 75 are located at one end of upper portion 50 and are configured to be connected to and supply electricity to the busbars in busbar casements 63B and 63A, respectively.

Support plates 61 and 62 are located at and attached to the bottom surfaces of busbar casements 63B and 64B, respectively. Support plates 61 and 62 are used to attach upper portion 50 to lower support assembly 49. In other embodiments of this invention, structural members other than support plates 61 and 62 can be utilized as the connecting members for connecting the upper portion and the lower support assembly.

As stated, upper portion 50 has a transport mode, as shown in FIGS. 7 and 8, and a deployed mode, as shown in FIGS. 9 and 10. In the transport mode, arm segments 55B and 56B are in their folded or transport positions, substantially parallel to vertical supports 51 and 52, as shown in FIGS. 7 and 8. In the deployed mode, arm segments 55B and 56B are in their deployed positions, substantially perpendicular to vertical supports 51 and 52, as shown in FIGS. 9 and 10.

Upper portion 50 can be transported from its manufacturing facility to its job site and maneuvered in place at the job site with upper portion 50 in its transport mode, and without upper portion 50 and lower support assembly 49 being connected. Once lower support assembly 49 and upper portion 50 are in the desired location at the job site, lower support assembly 49 and upper portion 50 can be connected, and arm segments 55B and 56B can be rotated from their folded or transport positions to their deployed positions.

As also stated, the location of busbar casements 63A, 63B, 64A and 64B at the base of upper portion 50 reduces the risk of damage to those casements, and the busbars housed therein, vis-à-vis prior art aisle containment systems. Specifically, in the prior art aisle containment systems, the busbar casements are at the ends of the foldable arms, as shown in FIGS. 1-6 and discussed above. That location exposes those casements and the busbars housed therein to damage during transport of the aisle containment systems from the manufacturing site to the job sites and while maneuvering the aisle containment systems at the job sites. That damage exposure is reduced by locating the busbar casements at the base of the upper portions of the aisle containment systems.

What is described and illustrated herein are preferred embodiments of the invention and some variations of those embodiments. The descriptions and figures are intended to be for illustration only, and are not intended as limitations. Those skilled in the art will recognize that many other variations of the invention, as defined by the following claims, are possible.

What is claimed is:

1. An upper portion of an aisle containment system for a data center configured to be attached to a lower support assembly of the aisle containment system to form the aisle containment system, the upper portion comprising:

spaced vertical supports aligned in two parallel rows, the two parallel rows defining two longitudinal sides of the upper portion;
spaced horizontal supports that extend between and are attached to the spaced vertical supports;
at least one pair of arms (1) attached to the vertical supports or the horizontal supports and (2) configured to support services; and
at least one busbar casement; wherein:
one arm of the at least one pair of arms extends outwardly from each of the two longitudinal sides of the upper portion;
each arm of the at least one pair of arms includes at least one segment having a first position in which the at least one segment is substantially parallel to the vertical supports and a second position in which the at least one segment is substantially perpendicular to the vertical supports;
the at least one busbar casement is fixedly attached to the vertical supports and extends substantially parallel to the two longitudinal sides of the upper portion, substantially a length of the upper portion.

2. The upper portion of an aisle containment system according to claim 1, wherein the at least one busbar casement has openings in an exterior sidewall that are configured to receive connections to a busbar housed in the at least one busbar casement.

3. The upper portion of an aisle containment system according to claim 2, wherein the openings are spaced elongated slots.

4. The upper portion of an aisle containment system according to claim 1, wherein there is at least one of the at least one busbar casement at each of the two longitudinal sides of the upper portion.

5. The upper portion of an aisle containment system according to claim 4, wherein the at least one busbar casement includes at least two of the at least one busbar casement at the each of the two longitudinal sides of the upper portion.

6. The upper portion of an aisle containment system according to claim 1, wherein:
each of the spaced vertical supports includes upper and lower ends; and
the at least one busbar casement is attached to the lower ends of the spaced vertical supports.

7. The upper portion of an aisle containment system according to claim 6, wherein the at least one busbar casement is attached to the lower ends of the spaced vertical supports at positions lower than the attachment of the at least one pair of arms to the vertical supports or the horizontal supports.

8. The upper portion of an aisle containment system according to claim 1, further comprising plates at lower ends of the vertical supports that are configured to be attached to the lower support assembly;
wherein the at least one busbar casement is between the lower ends of the vertical supports and the plates.

9. The upper portion of an aisle containment system according to claim 1, wherein the at least one busbar casement does not extend farther outwardly from the vertical supports than the at least one pair of arms when the at least one segment is in the first position or the second position.

\* \* \* \* \*